United States Patent [19]
Liu et al.

[11] Patent Number: 5,989,979
[45] Date of Patent: Nov. 23, 1999

[54] METHOD FOR CONTROLLING THE SILICON NITRIDE PROFILE DURING PATTERNING USING A NOVEL PLASMA ETCH PROCESS

[75] Inventors: Wen Jun Liu; Pei Ching Lee; Mei Sheng Zhou, all of Singapore, Singapore

[73] Assignee: Chartered Semiconductor Manufacturing Ltd., Singapore, Singapore

[21] Appl. No.: 09/208,920

[22] Filed: Dec. 10, 1998

[51] Int. Cl.[6] .................................................. H01L 21/76
[52] U.S. Cl. .......................... 438/439; 438/714; 438/724; 438/734; 438/744; 218/67; 218/72
[58] Field of Search .................... 438/439, 714, 438/724, 734, 744, FOR 117, FOR 120, FOR 124, FOR 126, FOR 127, FOR 229; 216/67, 72

[56] References Cited

U.S. PATENT DOCUMENTS

| | | | |
|---|---|---|---|
| 4,283,249 | 8/1981 | Ephrath | 156/643 |
| 4,803,181 | 2/1989 | Buchmann et al. | 437/228 |
| 5,286,344 | 2/1994 | Bialock et al. | 156/657 |
| 5,312,518 | 5/1994 | Kadomura | 156/662 |
| 5,314,576 | 5/1994 | Kadomura | 156/655 |
| 5,318,668 | 6/1994 | Tamaki et al. | 156/662 |
| 5,338,395 | 8/1994 | Keller et al. | 156/643 |
| 5,387,312 | 2/1995 | Keller et al. | 156/662 |
| 5,431,772 | 7/1995 | Babie et al. | 156/643 |
| 5,854,136 | 12/1998 | Huang et al. | 438/714 |

*Primary Examiner*—Wael M. Fahmy
*Assistant Examiner*—Long Pham
*Attorney, Agent, or Firm*—George O. Saile; Rosemary L. S. Pike

[57] ABSTRACT

A novel anisotropic plasma etching process for forming patterned silicon nitride ($Si_3N_4$) layers with improved critical dimension (CD) control while minimizing the $Si_3N_4$ footing at the bottom edge of the $Si_3N_4$ pattern is achieved. A pad oxide/silicon nitride layer is deposited on a silicon substrate. A patterned photoresist layer is used as an etching mask for etching the silicon nitride layer. By this invention, a chlorine ($Cl_2$) breakthrough plasma pre-etch forms a protective polymer layer on the sidewalls of the patterned photoresist and removes residue in the open areas prior to etching the $Si_3N_4$. The $Si_3N_4$ is then aniso-tropically plasma etched using an etch gas containing $SF_6$. The polymer layer, formed during the $Cl_2$ pre-etch, reduces the lateral recessing of the photoresist when the $Si_3N_4$ is etched, and results in improved patterned $Si_3N_4$ profiles with reduced CD bias, and minimizes $Si_3N_4$ footings at the bottom edge of the $Si_3N_4$ pattern.

21 Claims, 3 Drawing Sheets

METHOD FOR CONTROLLING THE SILICON NITRIDE PROFILE DURING PATTERNING USING A NOVEL PLASMA ETCH PROCESS

BACKGROUND OF THE INVENTION

(1) Field of the Invention

The present invention relates to the fabrication of integrated circuits, and more particularly to a method for forming patterned silicon nitride ($Si_3N_4$) layers with improved critical dimension (CD) control while minimizing the $Si_3N_4$ footing at the edge of the $Si_3N_4$ pattern. The method uses an improved plasma etch process that utilizes chlorine as one of the etchant gases.

(2) Description of the Prior Art

Current trends in ultra large scale integration (ULSI) requires sub-micrometer feature sizes to increase the circuit density on the chip. These sub-micron feature sizes require a reliable anisotropic plasma etching of semiconductor materials such as $Si_3N_4$, polysilicon, refractory metal silicides, and other semiconductor materials with high aspect ratio and good critical dimension control. One particular area of processing where this is important is the etching of $Si_3N_4$ layers on a silicon substrate as an oxidation barrier mask used for selectively growing a thermal oxide by the LOCal Oxidation of Silicon (LOCOS) method commonly practiced in the industry.

However, as shown in FIGS. 1 and 2, problems can arise when open areas are etched in the $Si_3N_4$ using conventional photolithographic techniques and conventional anisotropic plasma etching, such as when using a sulfur hexafluoride ($SF_6$) etchant gas. These problems are best understood by first referring to substrate structure in FIG. 1. The silicon substrate 10 typically has a pad oxide 12 formed on the surface to reduce stress, and then a $Si_3N_4$ layer 14 is deposited. A blanket photoresist layer 16 is spin coated and is patterned to leave portions over device areas on the substrate, while exposing the $Si_3N_4$ 14 in the areas where field oxide (FOX) is desired. Typically the photoresist layer 16 is patterned to have a critical dimension (CD), as shown in FIG. 1. However, residual photoresist A at the bottom edges of the open areas can result in etching problems. And as shown in FIG. 2, during plasma etching of the $Si_3N_4$, the photoresist pattern is also laterally recessed a distance X, resulting in an undesirable CD bias in the $Si_3N_4$ layer 14 and resulting in a $Si_3N_4$ foot or footing A'. Residual photoresist A depicted in FIG. 1 can also exacerbate the problem by resulting in residual $Si_3N_4$ A".

Several methods for etching $Si_3N_4$ layers with improved profiles have been reported in the literature. In U.S. Pat. No. 5,431,772 to Babie et al. a two-step process is described for etching $Si_3N_4$. A first etch is carried out using a gas containing fluorine radicals to remove surface oxide on the $Si_3N_4$ layer, and a second etch using a bromine-containing gas is used to selectively etch the exposed $Si_3N_4$ to the pad oxide. Kadamura in U.S. Pat. Nos. 5,312,518 and 5,314,576 uses a sulfur fluoride gas and a nitrogen source to form a sulfur nitride based compound that prevents sidewall etching during the $Si_3N_4$ etch. Tamaki et al. in U.S. Pat. No. 5,318,668 teach a method of etching a $Si_3N_4$ layer using an etchant gas of $ClF_3$ and HBr which concurrently forms a $SiBr_4$ to protect the sidewalls from etching while free fluorine is generated for etching the $Si_3N_4$. Bialock et al. in U.S. Pat. No. 5,286,344 provide an etch process for selectively etching openings with vertical sidewalls in $SiO_2$ to a $Si_3N_4$ etch-stop layer. In U.S. Pat. No. 4,283,249 to Ephrath, a method is described for selectively etching $SiO_2$, $Si_3N_4$, and silicon oxynitride to a silicon substrate by introducing hydrogen to the $CF_4$ etchant gas. U.S. Pat. No. 4,803,181 to Buchmann et al. teaches a method for using silylated sidewalls on a patterned photoresist layer and removing the non-silylated photoresist to make an extremely narrow etch mask for patterning underlying semiconductor films. Keller et al. in U.S. Pat. No. 5,387,312 utilize an etch chemistry comprising $NF_3$ and $N_2$ that results in a highly selective etch (4–5 times faster) of $Si_3N_4$ to pad oxide.

And U.S. Pat. No. 5,338,395 to Keller et al. utilizes a gas chemistry of $NF_3$ and $Cl_2$ to provide a predominantly physical sputtering of the $Si_3N_4$ layer, and then uses a second etching step using $NF_3$, HBr chemistry for selectively etching the remaining $Si_3N_4$ to pad oxide.

Al though there are a number of methods for etching $Si_3N_4$ layers, there is still a strong need to provide an improved method for closely spaced $Si_3N_4$ patterns while minimizing the CD bias and providing improved $Si_3o_4$ profiles.

SUMMARY OF THE INVENTION

It is a principal object of this invention to provide $Si_3N_4$ patterns with improved critical dimension (CD) bias while minimizing the $Si_3N_4$ footings in narrow openings.

It is another object of this invention to minimize the CD bias using a chlorine ($Cl_2$) breakthrough plasma etch which forms a polymer on the photoresist sidewalls to more accurately control the $Si_3N_4$ footing when the photoresist pattern is used as an etch mask for etching the $Si_3N_4$ layer.

The method begins by providing a substrate composed of a single crystal silicon, which can be either N- or P-doped. A thermal oxide layer is formed on the substrate surface, preferably by thermal oxidation, to provide a stress-release pad oxide layer. A $Si_3N_4$ layer is deposited on the pad oxide layer. The $Si_3N_4$ layer is deposited by low-pressure chemical vapor deposition (LPCVD). A photoresist layer is deposited on the $Si_3N_4$ layer, for example by spin coating. After a pre-bake, the photoresist layer is then exposed through a mask or reticle and is developed to form open areas over portions of the $Si_3N_4$ layer. The $Si_3N_4$ is then etched in the open areas. In the conventional method, anisotropic plasma etching using an etchant gas such as sulfur hexafluoride ($SF_6$) is used to etch a patterned $Si_3N_4$ layer. Unfortunately, when the openings are narrow, residual $Si_3N_4$ can be left at the bottom corners of the open areas, which have a foot-shape appearance (called footings), and are undesirable. For example, when the patterned $Si_3N_4$ is used as an oxidation barrier mask for forming field oxide (FOX) isolation, by the conventional LOCal Oxidation of Silicon (LOCOS) method, electrical shorts can occur across the isolation between device areas. By the method of this invention, the $Si_3N_4$ foot is minimized by carrying out an anisotropic plasma etching, or pre-etch, using a first etchant gas, preferably chlorine ($Cl_2$). This $Cl_2$ etch step forms a polymer on the sidewalls of the photoresist layer, which prevents lateral etching of the photoresist and minimizes the critical dimension (CD) bias during the $Si_3N_4$ etch. The $Si_3N_4$ layer is now etched to the pad oxide layer using a conventional anisotropic plasma etching and an etchant gas mixture such as $SF_6$ and helium (He). The pre-etch in $Cl_2$ makes it possible to use this more conventional anisotropic plasma etching in $SF_6$ to better control the CD and the $Si_3N_4$ profile without forming $Si_3N_4$ footings during etching. The photoresist is then removed, and the exposed silicon substrate is thermally oxidized to form the field oxide isolation, while the $Si_3N_4$ portions protect the device areas on the substrate from oxidation.

Although the method is particularly useful for forming reliable field oxide isolation, the method is also applicable to etching polysilicon, silicon oxide, and metal with minimum critical dimension loss.

BRIEF DESCRIPTION OF THE DRAWINGS

The objects and other advantages of this invention are best understood in the preferred embodiment with reference to the attached drawings that include.

DESCRIPTION OF THE PREFERRED EMBODIMENT

The method for patterning silicon nitride ($Si_3N_4$) layers with improved critical dimension (CD) bias while minimizing the $Si_3N_4$ footing at the edge of the $Si_3N_4$ pattern is now described in detail. The method uses an improved plasma breakthrough pre-etch process prior to etching the $Si_3N_4$ layer. The pre-etch uses chlorine to form a polymer on the sidewalls of the patterned photoresist to minimize the CD bias and to remove any residual photoresist in the open areas. The method is particularly useful for forming more reliable field oxide isolation by the LOCal Oxidation of Silicon (LOCOS) method for isolating device areas on a silicon substrate, as commonly practiced in the industry. However, it should be understood by those skilled in the art that the method can also be used to etch polysilicon, silicon oxide, and metal layers with improved critical dimension (CD) bias control and with minimum footings in the patterned layers.

Figure 3:
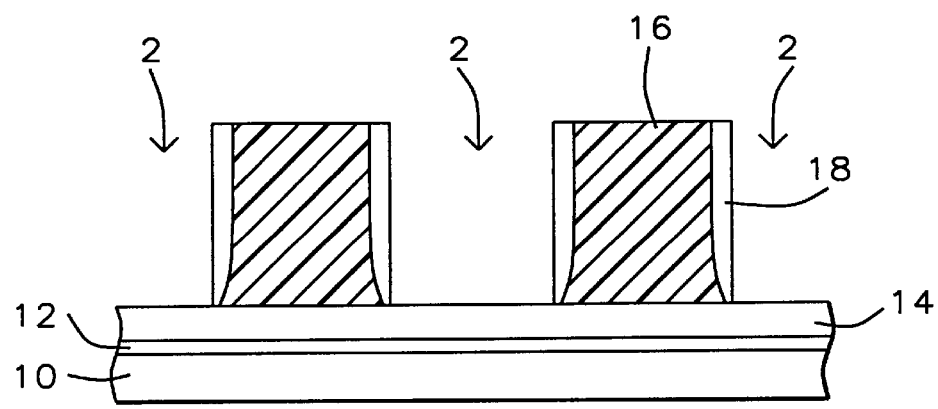
FIG. 3 shows a cross-sectional view, by the method of this invention, of the photoresist pattern after a $Cl_2$ plasma etch breakthrough step and prior to etching the $Si_3N_4$.

Referring now to FIG. 3, the method for forming the patterned $Si_3N_4$ layer with improved profile and CD bias starts by providing a silicon substrate 10. The preferred substrate 10 is a P$^-$ doped single-crystal silicon with a <100> preferred crystallographic orientation. A pad oxide 12 is formed on the substrate 10, for example by thermal oxidation in an oxygen ambient. Typically the pad oxide 12 is formed on the substrate surface to provide a stress-release layer to protect the substrate from stress-induced crystalline damage. The pad oxide 12 is preferably formed by subjecting the substrate to a dry oxygen ambient in an oxidation furnace at a temperature of between about 800 and 1000° C. The pad oxide is preferably grown to a thickness of between about 100 and 300 Angstroms, and more specifically to a thickness of about 190 Angstroms.

Next, also shown in FIG. 3, a silicon nitride ($Si_3N_4$) layer 14 is deposited on the pad oxide layer 12. For example, the $Si_3N_4$ can be deposited by low-pressure chemical vapor deposition (LPCVD) using a reactant gas mixture such as dichlorosilane ($SiCl_2H_2$) and ammonia ($NH_3$), and is deposited at a temperature of between about 650 and 800° C. The $Si_3N_4$ layer 14 is deposited to a preferred thickness of between about 1000 and 3000 Angstroms.

Figure 1:
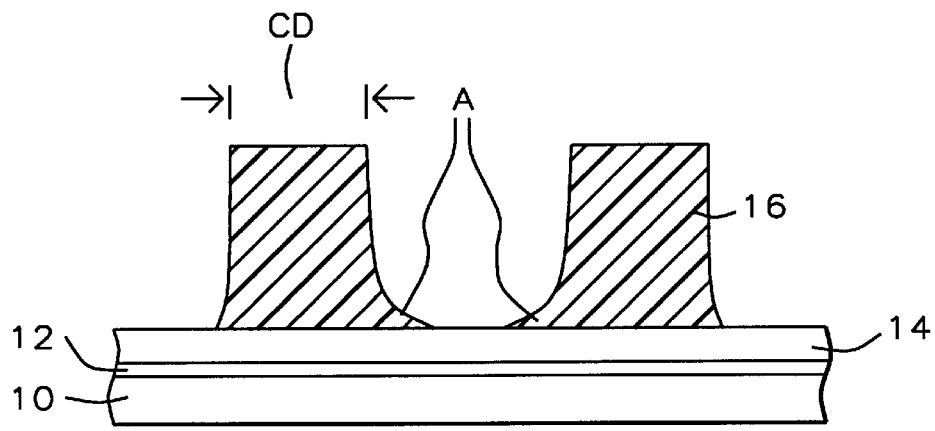
FIGS. 1 shows a schematic cross-sectional view by the prior art of a photoresist pattern with narrow spacing and prior to $Si_3N_4$ etching.
Figure 2:
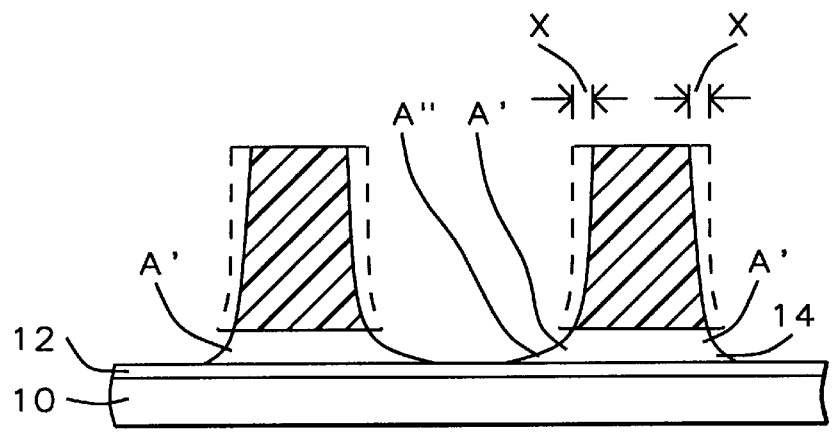
FIG. 2 is a cross-sectional view by the prior art of the photoresist pattern after the $Si_3N_4$ etching and showing unwanted $Si_3N_4$ footings at the base of the patterned $Si_3N_4$ layer.

Still referring to FIG. 3, a photoresist layer 16 is deposited on the $Si_3N_4$ layer 14, for example by spin coating. The photoresist layer is then pre-baked and exposed through a mask or reticle (not shown). The photoresist is then developed to retain portions over areas where devices are desired, and having narrow open areas 2 between and round the portions of the photoresist 16 where a field oxide (FOX) is desired. The narrow open areas 2 are typically between about 0.3 and 0.5 micrometer (um) for ULSI devices, and are susceptible to having residual photoresist in the open areas 2, as depicted in the prior art of FIG. 1, and after etching the $Si_3N_4$ can also result in $Si_3N_4$ feet or footings on the bottom of the open areas, as depicted in the prior art of FIG. 2.

Now, by the method of this invention, a chlorine ($Cl_2$) breakthrough step is performed prior to etching the $Si_3N_4$ layer 14. The $Cl_2$ breakthrough step consists of anisotropic plasma etching in a reactive ion etcher using $Cl_2$ as the etching gas. This $Cl_2$ etch step forms a polymer 18 on the sidewalls of the photoresist layer 16, which prevents lateral etching of the photoresist and minimizes the critical dimension (CD) bias during the $Si_3N_4$ etch that is carried out later. The $Cl_2$ etch is preferably carried out at a chamber pressure of between about 100 and 500 milliTorr, a $Cl_2$ flow rate of between about 50 and 250 standard cubic centimeters per minute (sccm). The chlorine breakthrough time (etch time) is optimized to minimize the $Si_3N_4$ foot but to avoid excessive buildup of polymer on the photoresist sidewalls. More specifically, the $Cl_2$ breakthrough time is between about 30 and 120 seconds. The polymer 18 is composed principally of carbon, hydrogen, oxygen, and chlorine.

Figure 4:
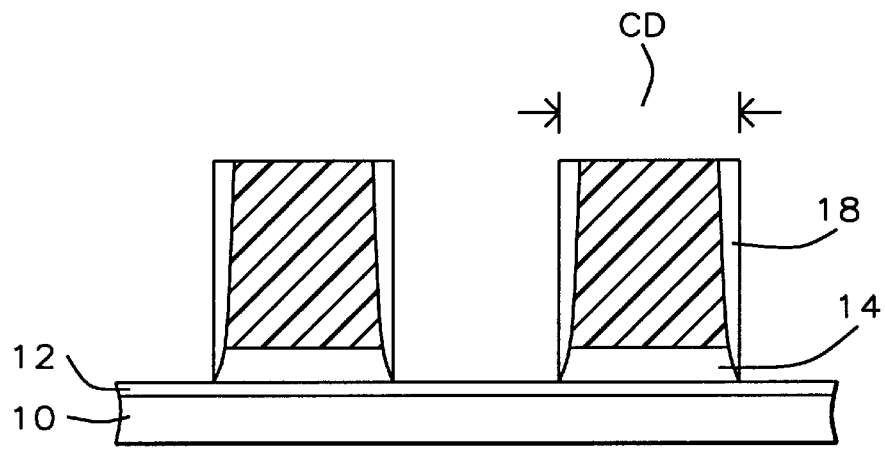
FIG. 4 shows a cross-sectional view, by the method of this invention, of the photoresist pattern after the $Cl_2$ plasma etch breakthrough step and after etching the $Si_3N_4$.

Referring to FIG. 4, the $Si_3N_4$ layer 14 can be etched selectively to the pad oxide 12 on the substrate 10 using reactive ion etching. The $Si_3N_4$ layer 14 is preferably etched in an etchant gas mixture of $SF_6$ and He. Preferably the etch rate ratio of the $Si_3N_4$ to the pad oxide 12 is about 10:1. As depicted in FIG. 4, the polymer layer 18 reduces the CD bias of the patterned $Si_3N_4$ layer 14 while eliminating or minimizing the $Si_3N_4$ footings.

The photoresist layer 16 and the polymer 18 are now removed, for example by plasma ashing in oxygen and/or by wet stripping. The exposed silicon substrate 10 is thermally oxidized using the conventional LOCOS method to form the field oxide isolation (not shown), while the $Si_3N_4$ portions protect the device areas on the substrate from oxidation. Since the $Si_3N_4$ footings and residual $Si_3N_4$ are not present, a more reliable field oxide is formed.

EXAMPLE

Figure 5:
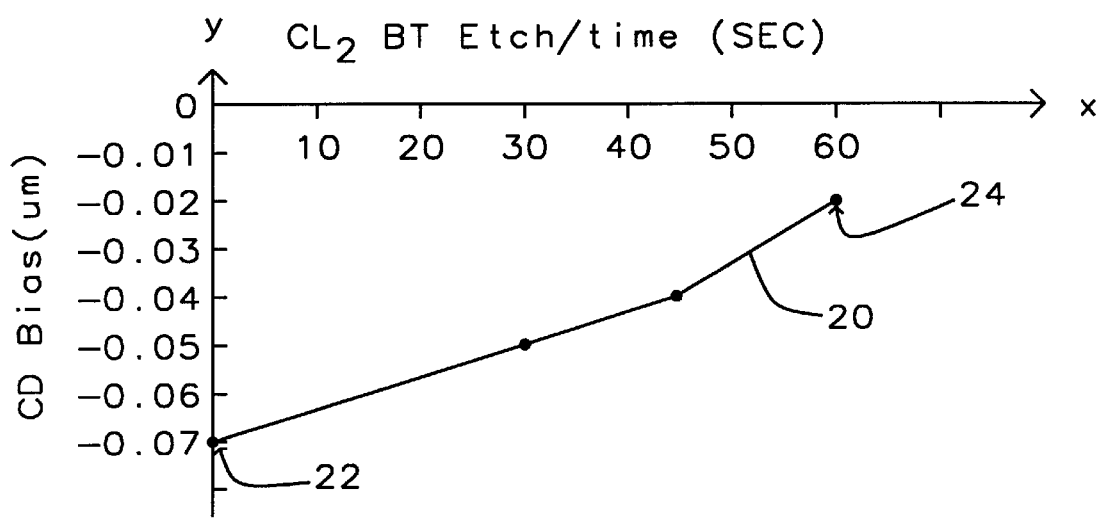
FIG. 5 shows a graph of the improvement in critical dimension bias in micrometers (um) as a function of $Cl_2$ breakthrough etch time.

To better appreciate this invention an example is provided. In this example, test wafers including a control wafer were prepared. The test wafers are silicon substrates on which a pad oxide was grown having a thickness of 190Angstroms. A silicon nitride layer was then deposited by LPCVD to a thickness of 1900 Angstroms. A high-contract I-line photoresist layer was spin coated and patterned by conventional lithographic techniques to form an array of closely spaced lines. The test wafers were then subjected to a $Cl_2$ breakthrough pre-etch for increasing times up of 30 seconds, 45 seconds, and 60 seconds, followed by the $Si_3N_4$ plasma etch using a gas mixture of $SF_6$ and He. The control wafer was etched without a $Cl_2$ breakthrough pre-etch. After etching the $Si_3N_4$, the photoresist was removed and the linewidths were measured using a scanning electron microscope (SEM). The critical dimension (CD) bias in um was plotted as a function of $Cl_2$ breakthrough (BT) etch time T in seconds as shown by curve 20 in FIG. 5. The control wafer without the $Cl_2$ etch is depicted on the Y axis at point 22, and has a CD bias of 0.07 um. By the method of this invention, the CD bias of the $Si_3N_4$ linewidth is observed to decrease with increasing $Cl_2$ etch time, resulting in a substantially reduced CD bias of only 0.02 um after a 60-second $Cl_2$ etch, as indicated by the point 24 on the curve 20 in FIG. 5.

Figure 6:
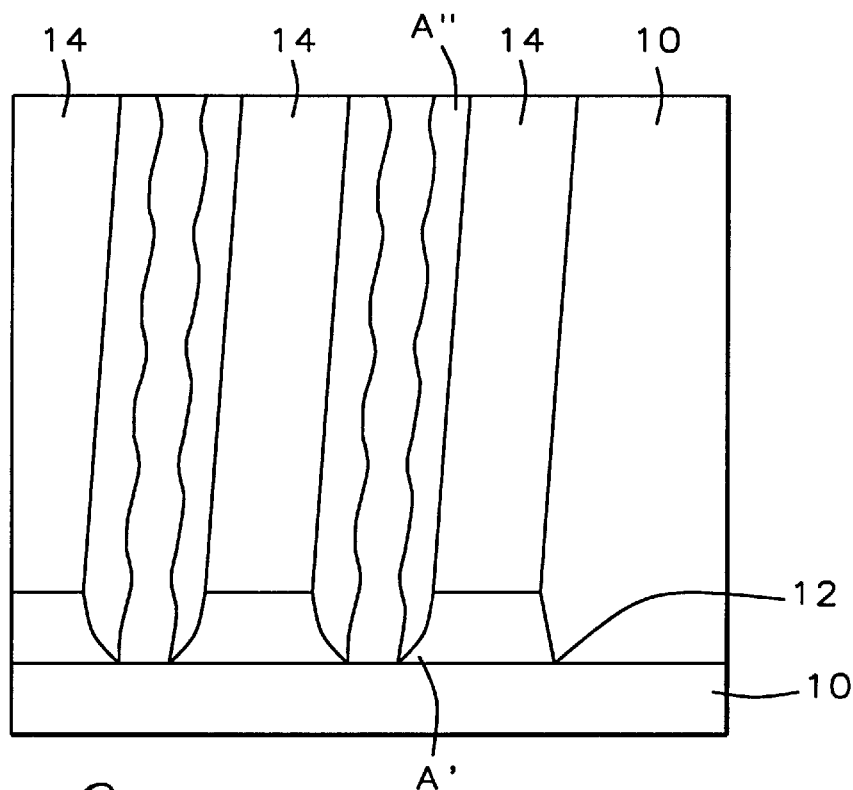
FIGS. 6 and 7 show schematic replicas of scanning electron microscope (SEM) photographs without the $Cl_2$ breakthrough etch and with the $Cl_2$ breakthrough etch, respectively, after removing the photoresist etch mask.
Figure 7:
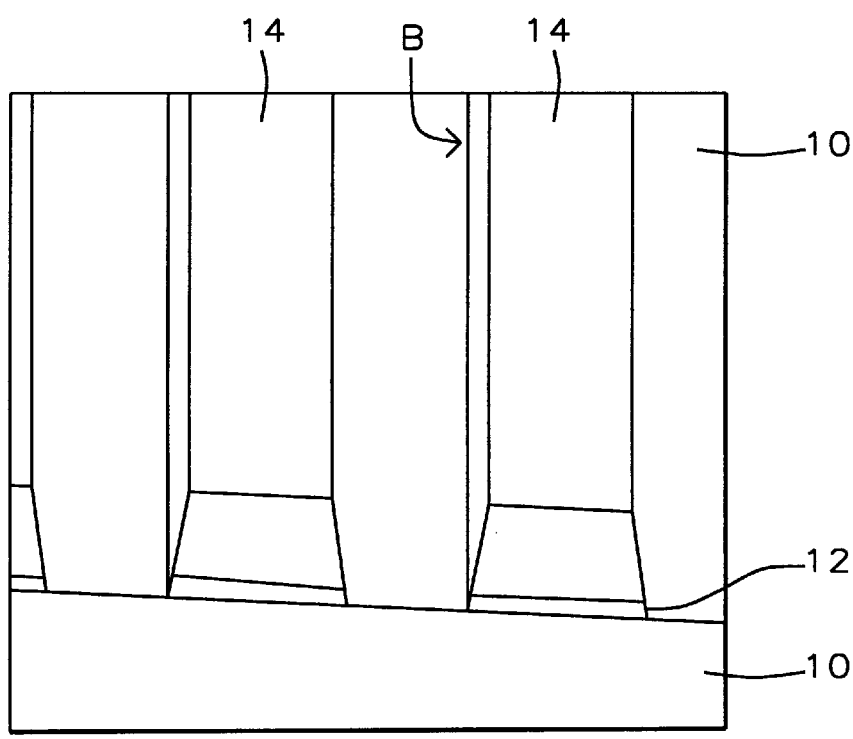

FIGS. 6 and 7 show drawings replicating SEM photos of the silicon nitride lines 14 on wafers 10 cleaved through the $Si_3N_4$ lines, respectively, for a control wafer without the $Cl_2$ breakthrough pre-etch and one of the test wafer with the $Cl_2$ etch. As can be seen for the control wafer in FIG. 6, the $Si_3N_4$ lines are narrower with increased CD bias due to the lateral recessing of the photoresist during the $SF_6$ and He plasma etching. Also, $Si_3N_4$ footing A' and $Si_3N_4$ residue A" remain between the narrowly spaced $Si_3N_4$ lines when the $Cl_2$ breakthrough pre-etch is not used. As shown in FIG. 7 for the test wafer with the $Cl_2$ pre-etch, the silicon nitride lines 14 have a much improved profile with reduced CD bias and no $Si_3N_4$ footing at the bottom edge B of the $Si_3N_4$ lines 14.

Although the method is particularly useful for forming reliable field oxide isolation, the method is also applicable to etching polysilicon, silicon oxide, and metal with reduced critical dimension loss.

While the invention has been particularly shown and described with reference to the preferred embodiment thereof, it will be understood by those skilled in the art that various changes in form and details may be made without departing from the spirit and scope of the invention.

What is claimed is:

1. A method for forming patterned silicon nitride layers with improved profiles and critical dimensions on a semiconductor substrate comprising the steps of:

forming a pad oxide layer by thermal oxidation on said substrate;

depositing a silicon nitride layer on said pad oxide layer;

coating a photoresist layer on said silicon nitride layer;

patterning said photoresist layer to form open areas over portions of said silicon nitride layer;

anisotropically plasma etching using a first etchant gas to form a polymer on the sidewalls of said photoresist layer in said open areas;

anisotropically and selectively plasma etching said silicon nitride layer in said open areas to said pad oxide using a second etchant gas to pattern said silicon nitride layer, whereby said polymer on said sidewalls of said photoresist layer reduces loss in said critical dimension of said patterned silicon nitride layer and minimizes the formation of silicon nitride footings at the bottom edges of said patterned silicon nitride layer;

removing said photoresist and completing said patterned silicon nitride layer having said improved profile.

2. The method of claim 1, wherein said pad oxide layer is grown to a thickness of between about 100 and 300 Angstroms.

3. The method of claim 1, wherein said silicon nitride layer is deposited by low-pressure chemical vapor deposition to a thickness of between about 1000 and 3000 Angstroms.

4. The method of claim 1, wherein said first etchant gas is chlorine.

5. The method of claim 1, wherein said anisotropic plasma etching using said first etchant gas is achieved in a reactive ion etcher for a time of at least 30 seconds.

6. The method of claim 1, wherein said polymer is composed of carbon, hydrogen, oxygen, and chlorine.

7. The method of claim 1, wherein said second etchant gas contains sulfur hexafluoride, and said anisotropic plasma etching using said second etchant gas is carried in a reactive ion etcher.

8. A method for forming patterned silicon nitride layers with improved profiles and critical dimensions on a silicon semiconductor substrate comprising the steps of:

forming a pad oxide layer by thermal oxidation on said substrate;

depositing a silicon nitride layer on said pad oxide layer;

coating a photoresist layer on said silicon nitride layer;

patterning said photoresist layer to form open areas over portions of said silicon nitride layer;

anisotropically plasma etching using a first etchant gas composed of chlorine to form a polymer on the sidewalls of said photoresist layer in said open areas;

anisotropically and selectively plasma etching said silicon nitride layer in said open areas to said pad oxide using a second etchant gas containing sulfur hexafluoride to pattern said silicon nitride layer, whereby said polymer on said sidewalls of said photoresist layer reduces loss in said critical dimension of said patterned silicon nitride layer and minimizes the formation of silicon nitride footings at the bottom edges of said patterned silicon nitride layer;

removing said photoresist and completing said patterned silicon nitride layer having said improved profile.

9. The method of claim 8, wherein said pad oxide layer is grown to a thickness of between about 100 and 300 Angstroms.

10. The method of claim 8, wherein said silicon nitride layer is deposited by low-pressure chemical vapor deposition to a thickness of between about 1000 and 3000 Angstroms.

11. The method of claim 8, wherein said anisotropic plasma etching using said first etchant gas is achieved in a reactive ion etcher for a time of at least 30 seconds.

12. The method of claim 8, wherein said polymer is composed of carbon, hydrogen, oxygen, and chlorine.

13. The method of claim 8, wherein said anisotropic plasma etching using said second etchant gas is carried in a reactive ion etcher.

14. A method for forming field oxide isolation using a patterned silicon nitride layer with improved profile and critical dimensions on a silicon substrate comprising the steps of:

forming a pad oxide layer by thermal oxidation on said substrate;

depositing a silicon nitride layer on said pad oxide layer;

coating a photoresist layer on said silicon nitride layer;

patterning said photoresist layer to form open areas over portions of said silicon nitride layer;

anisotropically plasma etching with a first etchant gas to form a polymer on the sidewalls of said photoresist layer in said open areas;

anisotropically and selectively plasma etching said silicon nitride layer in said open areas to said pad oxide to pattern said silicon nitride layer, whereby said polymer on said sidewalls of said photoresist layer reduces loss in said critical dimension of said patterned silicon nitride layer and minimizes the formation of silicon nitride footings at the bottom edges of said patterned silicon nitride layer;

removing said photoresist;

thermally oxidizing said silicon substrate to complete said field oxide isolation.

15. The method of claim 14, wherein said pad oxide layer is grown to a thickness of between about 100 and 300 Angstroms.

16. The method of claim 14, wherein said silicon nitride layer is deposited by low-pressure chemical vapor deposition to a thickness of between about 1000 and 3000 Angstroms.

17. The method of claim 14, wherein said first etchant gas is chlorine.

18. The method of claim 14, wherein said anisotropic plasma etching using said first etchant gas is achieved in a reactive ion etcher for a time of at least 30 seconds.

19. The method of claim 14, wherein said polymer is composed of carbon, hydrogen, oxygen, and chlorine.

20. The method of claim 14, wherein said second etchant gas contains sulfur hexafluoride, and said anisotropic plasma etching using said second etchant gas is carried in a reactive ion etcher.

21. The method of claim 14, wherein said field oxide isolation is formed by thermal oxidation to a thickness of between about 2500 and 5500 Angstroms.

* * * * *